United States Patent
Lu et al.

(10) Patent No.: US 7,400,030 B2
(45) Date of Patent: Jul. 15, 2008

(54) SCHOTTKY DIODE WITH SILVER LAYER CONTACTING THE ZNO AND $MG_XZN_{1-X}O$ FILMS

(75) Inventors: Yicheng Lu, East Brunswick, NJ (US); Haifeng Sheng, Piscataway, NJ (US); Sriram Muthukumar, Highland Park, NJ (US); Nuri William Emanetoglu, Woodbury, NJ (US); Jian Zhong, Piscataway, NJ (US); Shaohua Liang, Somerset, NJ (US)

(73) Assignee: Rutgers, the State University of New Jersey, New Brunswick, NJ (US)

( * ) Notice: Subject to any disclaimer, the term of this patent is extended or adjusted under 35 U.S.C. 154(b) by 189 days.

(21) Appl. No.: 11/042,533

(22) Filed: Jan. 25, 2005

(65) Prior Publication Data

US 2005/0145970 A1      Jul. 7, 2005

Related U.S. Application Data

(63) Continuation of application No. 10/158,540, filed on May 30, 2002, now Pat. No. 6,846,731.

(60) Provisional application No. 60/344,337, filed on Jan. 4, 2002.

(51) Int. Cl.
    *H01L 29/04*      (2006.01)
(52) U.S. Cl. ............... 257/628; 257/627; 257/347; 257/352; 257/73; 257/74
(58) Field of Classification Search ............... None
See application file for complete search history.

(56) References Cited

U.S. PATENT DOCUMENTS 4,272,754 A      6/1981 Lou (Continued)

FOREIGN PATENT DOCUMENTS

DE      199 51 207 A1      4/2001

(Continued)

OTHER PUBLICATIONS

Emanetoglu, et al. Epitaxial Growth and Characterization of High Quality ZnO Films for Surface Acoustic Wave Applications. Proceedings of the 1997 IEEE Ultrasonics Symposium. Ontario, Canada, Oct. 5-8, 1997, IEEE Ultrasonics Symposium Proceedings, New York, NY: IEEE, US, vol. 1, Oct. 5, 1997, pp. 195-199.

(Continued)

*Primary Examiner*—Evan Pert
*Assistant Examiner*—Tan Tran
(74) *Attorney, Agent, or Firm*—Hoffmann & Baron, LLP (57) ABSTRACT

In the present invention, there is provided semiconductor devices such as a Schottky UV photodetector fabricated on n-type ZnO and $Mg_xZn_{1-x}O$ epitaxial films. The ZnO and $Mg_xZn_{1-x}O$ films are grown on R-plane sapphire substrates and the Schottky diodes are fabricated on the ZnO and $Mg_xZn_{1-x}O$ films using silver and aluminum as Schottky and ohmic contact metals, respectively. The Schottky diodes have circular patterns, where the inner circle is the Schottky contact, and the outside ring is the ohmic contact. Ag Schottky contact patterns are fabricated using standard liftoff techniques, while the Al ohmic contact patterns are formed using wet chemical etching. These detectors show low frequency photoresponsivity, high speed photoresponse, lower leakage current and low noise performance as compared to their photoconductive counterparts. This invention is also applicable to optical modulators, Metal Semiconductor Field Effect Transistors (MESFETs) and more.

24 Claims, 5 Drawing Sheets

U.S. PATENT DOCUMENTS

| | | | |
|---|---|---|---|
| 4,622,515 | A | 11/1986 | Everson |
| 4,623,426 | A | 11/1986 | Peters |
| 4,626,322 | A | 12/1986 | Switzer |
| 5,162,689 | A | 11/1992 | Fliegel et al. |
| 5,449,923 | A | 9/1995 | Kuo et al. |
| 6,184,564 | B1 | 2/2001 | Gould |
| 6,366,389 | B1 | 4/2002 | Wraback et al. |
| 6,846,731 | B2 * | 1/2005 | Lu et al. ............... 438/570 |

FOREIGN PATENT DOCUMENTS

| | | |
|---|---|---|
| EP | 1 172 858 A1 | 1/2002 |
| JP | 03241777 | 10/1991 |
| WO | WO00/59039 | 10/2000 |

OTHER PUBLICATIONS

Fabricius, et al. Ultraviolet detectors in thin sputtered ZnO films. Applied Optics, vol. 25, No. 16, Aug. 15, 1986, pp. 2764-2767.

Gorla et al. "Structural, optical, and surface acoustic wave properties of epitaxial ZnO films grown on (01-12) sapphire by metalorganic chemical vapor deposition", Journal of Applied Physics Letters, vol. 85, No. 5, Mar. 1, 1999, pp. 2595-2601.

Mead, C. A., "Surface Barriers on ZnSe and ZnO", Physics Letters, vol. 18, No. 3, Sep. 1965.

Liang, et al. ZnO Schottky ultraviolet photodetectors. Journal of Crystal Growth 225, 2001, pp. 110-113.

Liu, et al. Ultraviolet Detectors Based on Epitaxial ZnO Films Grown by MOCVD. Journal of Electronic Materials, vol. 29, No. 1, 2000, pp. 69-74.

Neville, et al. Surface Barriers on Zinc Oxide. Journal of Applied Physics, vol. 41, No. 9, Aug. 1970, pp. 3795-3800.

Park et al., "Metalorganic vapor-phase epitaxial growth and photluminescent properties of $Zn_{1-x}Mg_xO$ ($0<=X<=0.49$) thin films", Applied Physics Letters, vol. 79, n. 13, Abstract.

Sheng, et al. Schottky diode with Ag on ($11\bar{2}0$) epitaxial ZnO film. Applied Physics Letters, vol. 80, No. 12, Mar. 25, 2002, pp. 2132-2134.

Wraback et al., "High contrast, ultrafast optically addressed ultraviolet light modulator based upon optical anisotropy in ZnO films grown on R-plane sapphire", Applied Physics Letters, vol. 74, n. 4, Jan. 1999, Abstract.

Yang, et al. Ultraviolet photoconductive detector based on epitaxial $Mg_{0.34}Zn_{0.66}O$ thin films. Applied Physics Letters, vol. 78, No. 18, Apr. 30, 2001, pp. 2787-2789.

Zhang et al. "Structural and optical properties of ZnO films grown on R-A1203 substrates", Applied Physics Letters, vol. 79 n. 24, Dec. 2001, Abstract.

* cited by examiner

SCHOTTKY DIODE WITH SILVER LAYER CONTACTING THE ZNO AND MG$_x$ZN$_{1-x}$O FILMS

CROSS REFERENCE TO RELATED APPLICATIONS

This application is a continuation of co-pending application Ser. No. 10/158,540 filed on May 30, 2002, now U.S. Pat. No. 6,846,731 which claims priority to Provisional Application Ser. No. 60/344,337 filed on Jan. 4, 2002, the contents of which are incorporated herein by reference.

FIELD OF THE INVENTION

This invention relates generally to the field of optical and electronic technology and more particularly to application of Schottky contacts on ZnO and Mg$_x$Zn$_{1-x}$O films to be used on various semiconductor devices such as Schottky type UV photodetectors, Schottky diodes and Metal Semiconductor Field Effect Transistors (MESFETs) and more.

BACKGROUND OF THE INVENTION

Recently, there has been an increasing interest in high quality ZnO films due to the electrical and optical properties of ZnO. These properties include wide and direct energy bandgap (Eg ~3.3 eV at room temperature) and large photoresponse, a high free exciton bounding energy, availability of a native substrate, ability to be wet chemical-processed, ability to be grown below the temperature of 400° C., as well as having high resistance to radiation damage. In the past, an optically addressed high contrast UV light modulator was made on ZnO grown on an (01$\bar{1}$2) R-plane sapphire substrate. ZnO films are particularly promising for UV photodetectors due to their wide and direct bandgap and large photoresponse. It has been shown that with high quality epitaxial ZnO film, such detectors can achieve high speed operation. Recently, a ZnO p-n diode fabricated using excimer-laser doping has been reported, which makes ZnO promising in other broad device applications, such as Light-Emitting Diodes (LED) and lasers.

In the past, several different metals have been used as a contact metal on ZnO films. For example, epitaxial ZnO film based metal-semiconductor-metal (MSM) device structures have been fabricated using aluminum as the ohmic contact metal (see Ying Liu, C. R. Gorla, S. Liang, N. Emanetoglu, Y. Lu, "J. Electron. Mater.", 29, 69 (2000)). The device showed fast photoresponse time (~1 µs) due to high material quality of the ZnO epilayer. However, Schottky type photodetectors are more attractive due to their high speed and low noise performance. An important characteristic of the Schottky diode is its barrier height or turn-on voltage, sometimes called its knee voltage. Schottky barrier heights were first reported by C. A. Mead (see C. A. Mead, "Phys. Lett.", 18, 218 (1965)), for various metals' contacts on vacuum cleaved n-ZnO surfaces. It has been reported that silver (Ag) has a comparatively high Schottky barrier height (~0.62 eV) on the cleaved ZnO surface. R. C. Neville and C. A. Mead (see R. C. Neville and C. A. Mead, "J. Appl. Phys.", 41, 3795 (1970)) further investigated the surface barrier systems consisting of gold and palladium on chemically prepared bulk ZnO. In 1986, H. Fabricius et al. (see H. Fabricius, T. Skeltnep, and P. Bisgaard, "Appl. Opt." 25, 2764 (1986)), made Schottky barrier type UV photodiodes using gold (Au) as the contact metal on sputtered ZnO thin films. These diodes suffered from severe recombination due to the poor crystalline quality of the film. These photodiodes exhibited slow operating speed and low quantum efficiency due to a large amount of recombination centers in the polycrystalline ZnO layers. Currently, it is believed that no Schottky type of photodetector has been fabricated on ZnO epitaxial films. There is a need for a metal-ZnO Schottky contact which does not suffer from the deficiencies of the prior contacts and which exhibits the advantages mentioned above for broad device applications. It is believed that no Schottky type of photodetector has been fabricated on ZnO epitaxial films prior to this invention.

SUMMARY OF THE INVENTION

In accordance with the present invention, there is provided a fundamental semiconductor device structure and process technology having ZnO and Mg$_x$Zn$_{1-x}$O films epitaxially grown on an (01$\bar{1}$2) R-plane sapphire substrate and a Schottky diode fabricated with silver as a metal contact on the surface of ZnO and Mg$_x$Zn$_{1-x}$O films.

BRIEF DESCRIPTION OF THE DRAWINGS

FIG. 1 (a) is a cross-section field-emission scanning electron microscope image showing a smooth ZnO film on (01$\bar{1}$2) R-sapphire used in the present invention.

FIG. 1 (b) shows an x-ray scan of a ZnO film on (01$\bar{1}$2) R-sapphire used in the present invention.

FIG. 3 (a) shows a cross-section view of a ZnO Schottky diode of the present invention.

FIG. 3 (b) shows current voltage (I-V) characteristics of an Ag—ZnO Schottky diode of the present invention.

FIG. 3 (c) shows capacitance-voltage (C-V) characteristics of an Ag—ZnO Schottky diode of the present invention.

FIG. 4 (a) shows a ZnO metal-semiconductor-metal (MSM) structure of a semiconductor Schottky diode ultraviolet photodetector.

FIG. 4 (b) shows current-voltage (I-V) characteristics of ZnO diodes of the present invention with a circular pattern.

FIG. 5 (a) shows a ZnO interdigital (IDT) metal-semiconductor-metal (MSM) structure of a semiconductor ultraviolet photodetector.

FIG. 5 (b) shows current voltage (I-V) characteristics of a ZnO Schottky photodetector of the present invention with an Interdigital (IDT) structure.

BRIEF DESCRIPTION OF THE INVENTION

Figure 1:
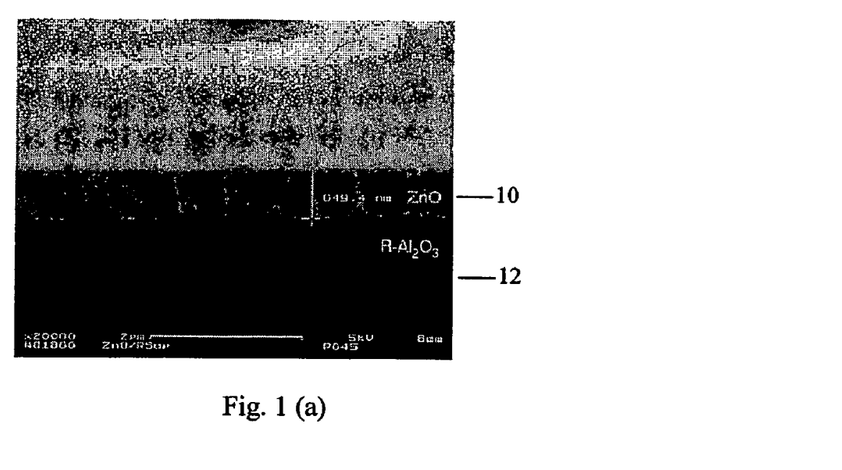

Referring to FIG. 1 (a), in an embodiment of the present invention there is shown a cross-section field-emission scanning electron microscope image of a ZnO epitaxial film (10) grown on an (01$\bar{1}$2) R-plane sapphire substrate, i.e., Aluminum Oxide (Al$_2$O$_3$) (12). The surface morphology as shown is flat and uniform. ZnO epitaxial films (10) are grown on (01$\bar{1}$2) sapphire substrates by metal organic chemical vapor deposition (MOCVD). Diethyl Zinc (DEZn) and O$_2$ are used as precursor materials for the growth and are introduced into the reactor by two separate injectors to reduce gas phase reaction. DEZn flow rate is preferably in the range of 50 to 100 sccm (seconds per cubic centimeters) at a bubbler temperature of 5° C. to 10° C., and $O_2$ flow rate is preferably 1000-2000 sccm. Useful growth temperatures preferably range from 380° C. to 420° C. Typical growth rates are in the range of 1-2 μm/hr and desirably between 1.2-1.5 μm/hr.

An example of a useful means for MOCVD is described in the U.S. patent application Ser. No. 09/905,191 filed Jul. 13, 2001. For example, the MOCVD system is used with a rotating disc reactor chamber. ZnO epitaxial films are grown using DEZn as the zinc precursor and oxygen as the oxidizer. The gas phase reaction between DEZn and oxygen can occur at room temperature and results in particulate formation, which degrades ZnO film properties, including surface morphology and crystallinity. In order to minimize the gas phase reaction, the MOCVD reactor is designed to have a flow-top configuration with high argon push flow. DEZn and oxygen are introduced into the reactor separately. The substrate is rotated at a high speed for improving the thickness uniformity. A 5000-6000 Å thick ZnO epilayer was grown with a carrier concentration of about $10^{16}$ cm$^{-3}$.

FIG. 1(b) is an X-ray scan of a ZnO film (10) of the present invention on R-plane sapphire (01$\bar{1}$2). The full-width at half maximum (FWHM) of the ZnO films are shown to be approximately 0.25°, as obtained from double crystal rocking curve measurements. The epitaxial relationships between ZnO (10) and R-plane sapphire (12) were determined to be (11$\bar{2}$0) ZnO parallel to (01$\bar{1}$2) Al$_2$O$_3$, and (0001) ZnO parallel to (0$\bar{1}$11) Al$_2$O$_3$. It is noted that (11$\bar{2}$0) oriented ZnO films are epitaxially grown on (01$\bar{1}$2) Al$_2$O$_3$ substrates with an atomically sharp interface. The primary crystal axis, i.e., the c-axis (0001) of ZnO lies in the surface plane (11$\bar{2}$0) of the ZnO films. This orientation offers several advantages. First, the lattice mismatch along the c-axis is 1.53%, while the mismatch along the direction perpendicular to the c-axis is 18.3%. Therefore, the overall lattice mismatch is small and much less than that of (0001) ZnO on C-plane sapphire. Second, this material system possesses in-plane anisotropy, which can be used in realizing novel electrical, optical and piezoelectric devices.

Figure 2:
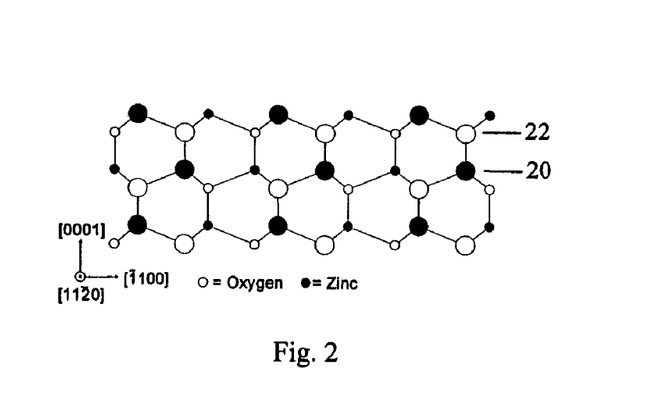
FIG. 2 shows a projection of the ZnO wurtzite structure along the (11$\bar{2}$0) direction used in the present invention, wherein the circles represent oxygen atoms and the dots zinc atoms.

Referring to FIG. 2, there is shown a projection of the ZnO (10) wurtzite structure along the (11$\bar{2}$0) direction used in the present invention. It can be seen that the c-axis (0001) is in the growth plane. In the (11$\bar{2}$0) ZnO (10) orientation, the cations (Zn) (20) and anions (O) (22) are in stoichiometric ratio, resulting in zero net charge on the surface. In contrast, the (0001) orientation has alternating layers of cations and anions, resulting in a non-zero dipole moment perpendicular to the surface. When there is a non-zero net dipole moment in the direction perpendicular to the surface in an ionic crystal lattice, the surface energy diverges, which makes the surface unstable.

The choice of the metal scheme is also the critical issue for Schottky contact. In the case of ZnO, metals such as Al, which react strongly with chalcogenides (O in ZnO), are expected to produce the most dissociated cations (Zn in ZnO), thus leading to low n-type barrier heights. In comparison, relatively less reactive metals, such as Ag, form higher barriers.

In the present invention, Ag (200 nm) and Al (200 nm) were deposited via electron beam evaporation to form Schottky and ohmic contacts, respectively. The semiconductor Schottky diodes may preferably have circular patterns, where the inner circle is the Schottky contact with a diameter of desirably about 150 μm, and the outside ring is the ohmic contact having a diameter desirably of about 320 μm. The gaps between Schottky and ohmic contacts vary from about 2 μm to about 16 μm. Silver Schottky contact patterns are fabricated using standard photolithography lift-off technique, while the Al ohmic contact patterns are formed using photolithography followed by wet chemical etching. For the Schottky contact, a thick Au layer was finally deposited on the top of the Ag layer, to act as an oxide-resistant layer. It is well known that in fabrication of Schottky contacts, the surface states, contaminants and defects of the semiconductor surface layer affect the barrier height and leakage current.

Figure 3:
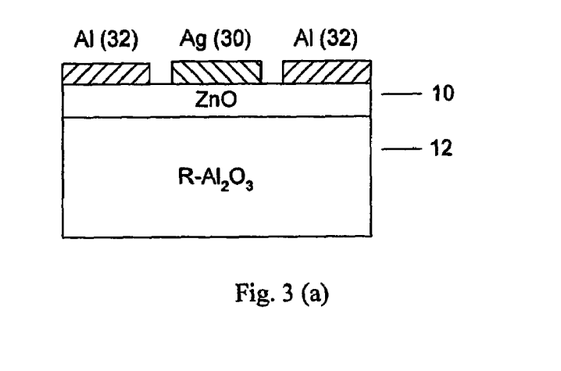

Referring to FIG. 3 (a), there is shown a cross-section view of a Schottky semiconductor diode with silver, Ag (30), used as a Schottky contact metal, and Al (32), used as an ohmic contact metal deposited on the ZnO film (10). The results of Schottky contacts fabricated on ZnO film (10) using Ag (30) as the contact metal are discussed herein. The barrier height is evaluated using I-V and C-V measurements. All the measurements were conducted in a dark chamber with a vacuum of $5 \times 10^{-3}$ Torr. The room temperature current-voltage (I-V) characteristics of an Ag/ZnO Schottky diode with an electrode gap of 8 μm are shown in FIG. 3 (b). Solid dots represent the forward characteristics, while the circles represent the reverse characteristics. It can be seen that there is a linear relationship over four decades at the central part of the forward bias. The curve bending for voltages V>0.5 V is due to series resistance, whereas the non-linearity at small forward bias is due to shunt resistance. The reverse biased characteristics show the leakage current is around 0.1 nA at 1 V reverse bias. The Schottky barrier height is determined to be about 0.89 eV by current-voltage-temperature (I-V-T) measurements, and the ideality factor ($\eta$) is found to be approximately 1.33 via the following equations. For thermionic emission and V>>3 kT/q, the general diode equation is:

$$I = I_0 \exp\left(\frac{qV - IR}{\eta kT}\right), \quad (1)$$

where I is the current, $I_0$ is the saturation current, V is the voltage, $\eta$ is the ideality factor, R the series resistance, K the Boltzmann's constant, and T the absolute temperature. The saturation current, $I_0$, is given by:

$$I_o = A^* S T^2 \exp\left(-\frac{\phi_B}{kT}\right), \quad (2)$$

where A* is the effective Richardson constant, S the Schottky contact area, and $\phi_B$ the barrier height. If the effective Richardson constant, A*, is known, such as in case of GaAs and Si, the barrier height, $\phi_B$, can be deduced from Eq. (2). However, for ZnO, to the best of our knowledge, an experimental value of A* has not been reported. Thus the barrier height $\phi_B$ can only be calculated using an estimated value of A*. In this work, the barrier height is estimated to be 0.83 eV using the effective Richardson constant A*=32 Acm$^{-2}$K$^{-2}$ (A*=4$\pi$qm*k$^2$h$^{-3}$, where m*~0.27 m$_0$[17]).

The capacitance-voltage (C-V) characteristics of an Ag—ZnO Schottky diode with an electrode gap of 8 μm in a circular pattern are shown in FIG. 3 (c). The C-V measurements were performed at a frequency of 100 KHZ and 1 MHZ. The Schottky barrier height is determined to be about 0.92 eV. In order to eliminate the effect of undetermined value of A*, activation energy measurements (i.e., I-V-T) were used to obtain the barrier height. In this study, the saturation currents, $I_0$ were measured at various temperatures (265K-340K), and $\phi_B$ and A* were determined via a plot of ln ($I_0/ST^2$) vs 1/T. Based on Eq. (2), $\Phi_B$=0.69 eV, and A*=0.15 $Acm^{-2}K^{-2}$ were obtained using a linear fitting. The ideality factor decreases slightly as temperature increases ($\eta$=1.29~1.37 as T=340~265K). The measured value of A* is much smaller than the theoretical value. Such a discrepancy was also observed on Au/GaN Schottky diodes, where it was attributed to the electrons tunneling through a barrier. The barrier height at room temperature is re-evaluated to be 0.69 eV using the experimentally deduced Richardson constant A*=0.15 $Acm^{-2}K^{-2}$ in Eq. (2), which agrees with the $\Phi_B$ obtained from the Richardson plot. For non-ideal Schottky diodes, a more meaningful barrier height is the flat band barrier height $\Phi_B$:

$$\Phi_{BF} = \eta\Phi_B - (\eta-1)\frac{kT}{q}\ln\left(\frac{N_C}{N_D}\right), \quad (3)$$

where $\eta$ is the ideality factor, $N_C$ the effective density of states in the conduction band, and $N_D$ the donor concentration. At room temperature, theoretical value of $N_C$ is calculated to be $3.5\times10^{18}$ cm$^{-3}$ for ZnO. The flat band barrier height is then determined to be 0.89 eV using Eq. (3).

The capacitance-voltage C-V measurements were performed at 100 kHz and 1 MHz. The Schottky barrier height is determined from:

$$\frac{1}{C^2} = \left(\frac{2}{\varepsilon q N_D S^2}\right)\left(V_{bi} - V - \frac{kT}{q}\right), \quad (4)$$

where the permittivity, $\varepsilon$ for ZnO is $9.0\varepsilon_0$, S is the Schottky contact area, and $V_{bi}$ the built-in potential. The barrier height is obtained from:

$$\Phi_{BC-V} = q\left[V_{bi} + \frac{kT}{q}\ln\left(\frac{N_C}{N_D}\right)\right], \quad (5)$$

Figure 5:
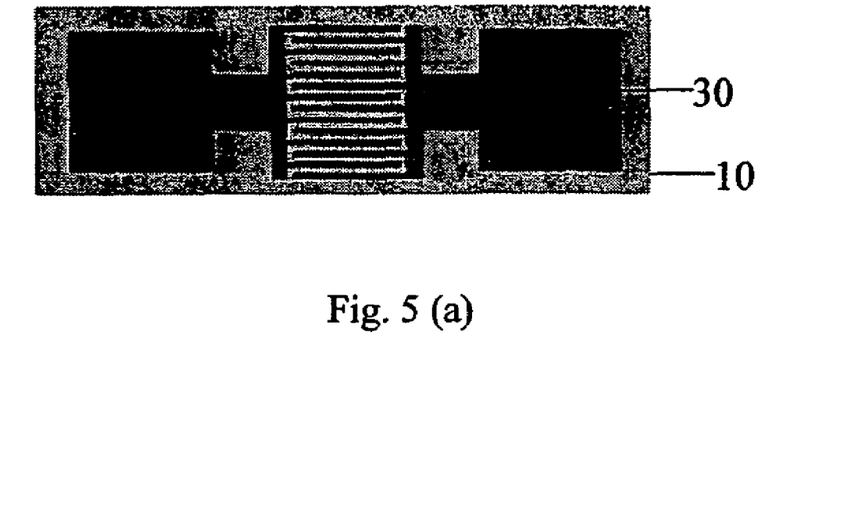

Shown in FIG. 5 are measured $C^{-2}$ vs. V at 100 KHz and 1 MHz, where it can be found that $V_{bi}$=0.83 V and the flat band Schottky barrier height $\Phi_{BC-V}$=0.92 eV. The flat band Schottky barrier height was determined to be 0.89 eV, and 0.92 eV using the I-V-T and C-V methods, respectively. The Schottky barrier height deduced from the I-V-T method is in good agreement with that from the C-V method, as they are within the experimental error range. The I-V-T and C-V use different mechanisms to characterize Schottky barrier height, therefore the barrier height obtained is more reliable since the two methods obtain the similar results.

Further, experiments are performed with UV photodetectors designed and fabricated using circular and interdigital (IDT) metal-semiconductor-metal (MSM) structures. Aluminum (Al) and silver (Ag) are used to form ohmic and Schottky contacts, respectively. The Ag—ZnO—Al circular structures are used for Schottky diode studies, while the Ag—ZnO—Ag structures served as Schottky type MSM photodetectors. The thickness of Ag layer is preferably 2000 Å. For the Schottky contact, a 500 Å thick Au layer was finally deposited on the top of the Ag layer, to act as an oxide-resistant layer.

Photoresponse measurements were performed using an Oriel optical system. A Xe-arc lamp and monochromator combination provided the light source. The photoresponse speed of the detector was also measured. The optical excitation source was the 337.1 nm line of a $N_2$ pulse laser, with a pulse width of 2 ns at a repetition rate of 40 Hz. Neutral density filters were used to control the optical power on the detector. Optical energy on the detector was about 10 nJ per pulse. The signal from a 50$\Omega$ (ohms)-load resistor was reported by a digital scope with a time resolution better than about 1 ns. The bias voltage was about 9V.

Figure 4:
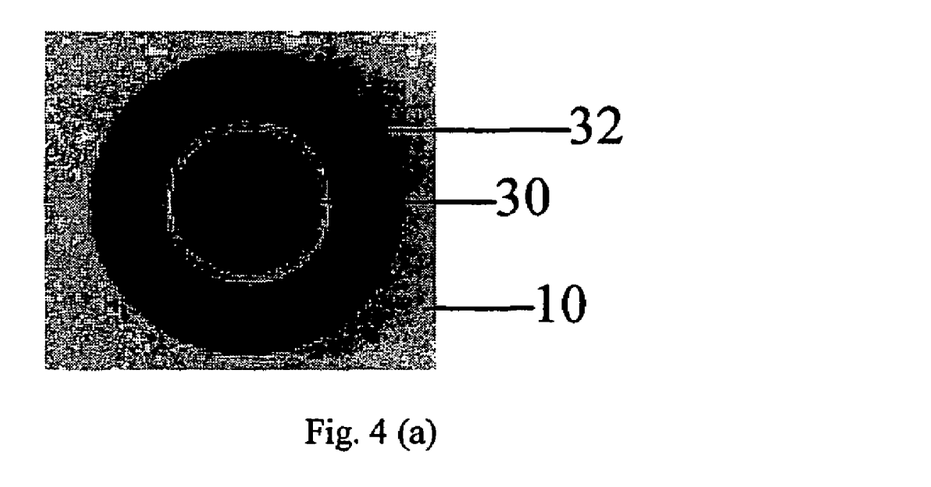

FIG. 4 (a) shows a metal-semiconductor-metal structure (MSM) of semiconductor Schottky diode UV Photodetector. Note that the semiconductor is (11$\bar{2}$0) ZnO 10 grown on (01$\bar{1}$2) R-plane sapphire. The ZnO MSM structure has a circular pattern 40, where the inner circle is a Schottky contact formed by Ag 30 and the outer ring is an ohmic contact formed by Al 32. The ZnO film 10 lies between the Al 32 and Ag 30. This gap of ZnO 10 between Al 32 and Ag 30 is the electrode gap, which varies from the range of 2 μm to 15 μm and is preferably 10 μm.

Shown in FIG. 4 (b) are the current voltage (I-V) characteristics of ZnO MSM of the Schottky diode UV photodetector shown in FIG. 4 (a), including both Schottky and ohmic types with an electrode gap of 10 μm. For comparison, Al—ZnO—Al structures are fabricated as the MSM photoconductive detectors. E-beam evaporation was utilized for the metal deposition. The linear I-V relation from the Al—ZnO—Al structure clearly indicates the ohmic behavior of the Al on n-type ZnO contact. On the other hand, the rectified I-V relation from the Ag—ZnO—Al confirms Schottky junction formation between Ag and n-type ZnO. The Schottky barrier height was determined to be about 0.84 eV and the ideality factor, $\eta$ was found to be approximately 1.5. At a reverse bias of I-V relation, the leakage current of the Ag—ZnO—Al was approximately 0.1 μA which is about 5 orders of magnitude smaller than that of the Al—ZnO—Al device, which was approximately 10 μA.

FIG. 5 (a) shows a ZnO interdigital (IDT) metal-semiconductor-metal structure of a semiconductor UV photodetector. Note that the semiconductor is (11$\bar{2}$0) ZnO 10 grown on (01$\bar{1}$2) R-plane sapphire. Ag, 30 is the metal deposited on ZnO 10 to form the Schottky contact, thereby forming the Ag—ZnO—Ag MSM IDT structure.

The Ag—ZnO—Ag MSM structure with IDT configuration such as shown in FIG. 5 (a) was used to evaluate the performance of the UV Schottky detector. FIG. 5 (b) shows the dark and photo-illuminated I-V characteristics of the UV Schottky detector shown in FIG. 5 (a). The wavelength and power of the illuminated light are 368 nm and 0.1 μW, respectively. The leakage current of the photodetector is about 1 nA at a bias of 5V. The breakdown starts at about 8V. The early and soft breakdown is mainly due to non-uniform field distribution, especially at the corners of the finger electrodes in the IDT configuration. The low-frequency photoresponsivity is about 1.5 A/W, which corresponds to a gain of 2.5. The photoconductive effect which occurs at the high field contributes to the large gain of 2.5, i.e., >1.

Figure 6:
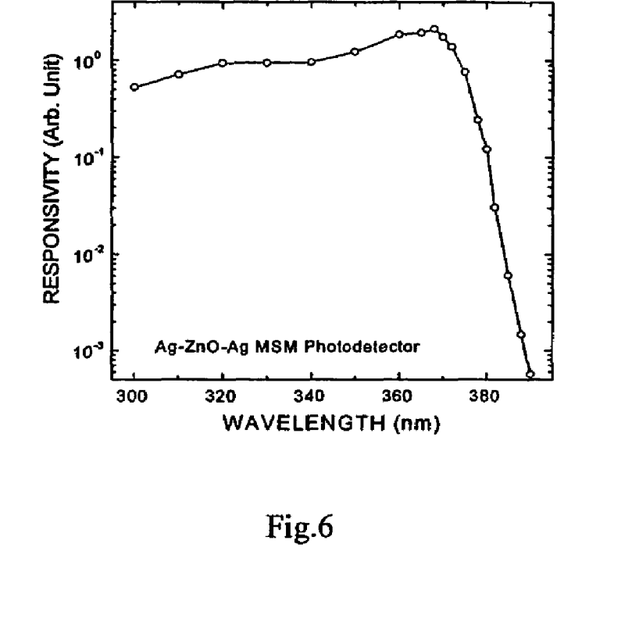
FIG. 6 shows a spectral-photoresponse of a ZnO Schottky photodetector of the present invention with an Interdigital (IDT) structure.

The spectra-photoresponse of the Ag—ZnO—Ag Schottky photodetector with an IDT structure is shown in FIG. 6. This figure shows that the responsivity drops more than 3 orders of magnitude from 370 to 390 nm. The sharp cut-off at wavelength of ~370 nm agrees with the ZnO energy bandgap of 3.35 eV. The responsivity decreased at the shorter wavelength range due to the decrease of the penetrating depth of the light, resulting in an increase of the surface recombination.

Figure 7:
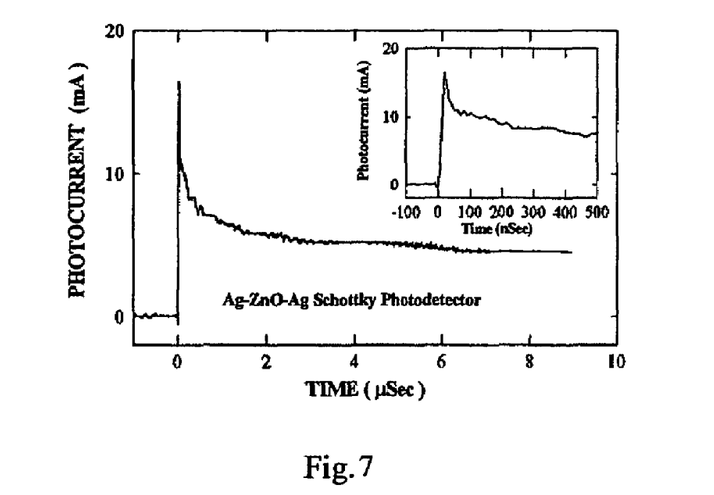
FIG. 7 shows a graph of a photocurrent as a function of response time of a ZnO Schottky photodetector of the present invention with an Interdigital (IDT) structure.

Finally, FIG. 7 is the photocurrent as a function of time from a ZnO Schottky photodetector. The photoresponse has a fast component, which rises within 12 ns and falls to 66% of its peak value within 50 ns as shown in the inset of FIG. 7.

After that, a slow process follows lasting about 5 ms (not shown in the figure). The fast response in a MSM detector is usually related to the transit time of the photo-generated carriers, while the slow response in a ZnO MSM detector is attributed to the trapping and emission of photo-generated carriers in the ZnO surface of the Schottky detector.

It is clear that the present invention demonstrates fabrication of Schottky diodes on ZnO epitaxial films grown on R-plane sapphire substrate using Ag as a Schottky contact metal. The Schottky barrier height was determined to be 0.85-0.90 eV measured using the I-V-T and C-V methods. Similarly, several experiments were performed with Schottky type UV photodetectors based on ZnO epitaxial films grown on R-plane sapphire substrate $Al_2O_3$. Ag was used to form Schottky contact on n-type ZnO. A low frequency photoresponsivity of 1.5 A/W at a bias of 5V was obtained. The leakage current of the device at 5V bias was in the order of 1 nA. The photoresponse of the detector showed a fast component with a rise time of 12 ns, and a fall time of 50 ns.

Although the invention is described herein with reference to ZnO film, it is to be noted that $Mg_xZn_{1-x}O$ films can be utilized to produce similar results. The direct band-gap of ZnO can be tuned from 3.3 eV to 4.0 eV by alloying ZnO with MgO to form the ternary compound, $Mg_xZn_{1-x}O$ in the Mg composition range of 0 to 0.34. In comparison, the $Mg_xZn_{1-x}O$ epitaxial films have shorter wavelength range than the ZnO epitaxial films. ($11\bar{2}0$) $Mg_xZn_{1-x}O$ epitaxial films are grown on ($01\bar{1}2$) sapphire substrates (R-plane) with different Mg contents. Schottky type photodetectors were fabricated with silver as Schottky metal contacts on surface plane of $Mg_xZn_{1-x}O$ films. The transmission measurements show that the cut-off wavelength varied with the amount of incorporation of Mg content. These photodetectors showed higher speed and lower leakage current compared to their photoconductive counterparts.

While the invention has been described in related to the preferred embodiments with several examples, it will be understood by those skilled in the art that various changes may be made without deviating from the fundamental nature and scope of the invention as defined in the appended claims.

What is claimed is:

1. A semiconductor Schottky contact comprising:
a $Mg_xZn_{1-x}O$ semiconductor epitaxial film having a ($11\bar{2}0$) family of planes, grown on a single crystal substrate having an orientation wherein primary symmetric axis (0001) of said $Mg_xZn_{1-x}O$ semiconductor epitaxial film lies on the surface of said substrate, thereby resulting in zero net charge on said $Mg_xZn_{1-x}O$ film and zero net dipole moment perpendicular to surface of said $Mg_xZn_{1-x}O$ film;
a metal layer deposited on said $Mg_xZn_{1-x}O$ film to form a Schottky contact, wherein said substrate is R-plane sapphire, ($11\bar{2}0$) $Al_2O_3$.

2. The Schottky contact of claim 1 wherein said metal layer is silver, Ag.

3. The Schottky contact of claim 2 wherein energy bandgap of the $Mg_xZn_{1-x}O$ film varies with Mg content.

4. A semiconductor Schottky diode, comprising:
a ZnO semiconductor epitaxial film having ($11\bar{2}0$) family of planes, grown on a single crystal substrate having an orientation wherein primary symmetric axis (0001) of said ZnO semiconductor epitaxial film lies on the surface of said substrate, and wherein the lattice mismatch between said substrate and said ZnO semiconductor film is small, thereby resulting in zero net charge on said ZnO film and zero net dipole moment perpendicular to surface of said ZnO film, wherein the said substrate is R-plane sapphire, ($01\bar{1}2$) $Al_2O_3$;
a metal deposited on said ZnO film to form a Schottky contact;
an ohmic metal deposited on said ZnO film to form an ohmic contact; and having means to being applied as a low leakage and high speed ultraviolet photodetector, wherein said ultraviolet photodetector comprises a circular metal-semiconductor-metal structure having an inner circle pattern of the Schottky contact deposited on said ZnO film having ($11\bar{2}0$) family of planes and an outer ring pattern of the ohmic electrode deposited on said ZnO film.

5. The Schottky diode of claim 4 wherein said metal is silver.

6. The Schottky diode of claim 4 wherein said ohmic metal is aluminum.

7. The Schottky diode of claim 4 wherein said Schottky contact is formed with a silver layer.

8. The Schottky diode of claim 4 wherein said ohmic electrode is formed with an aluminum layer.

9. The Schottky diode of claim 4 wherein said ultraviolet photodetector comprises:
a metal-semiconductor-metal structure with an interdigital (IDT) pattern, wherein the semiconductor is said ZnO film having ($11\bar{2}0$) family of planes grown on said single crystal substrate, and the metal is the Schottky metal deposited on said ZnO film.

10. The Schottky diode of claim 4 wherein said substrate is R-plane sapphire, ($01\bar{1}2$) $Al_2O_3$.

11. The Schottky diode of claim 4 wherein said Schottky metal is silver.

12. A semiconductor Schottky diode, comprising:
a $Mg_xZn_{1-x}O$ semiconductor film having ($11\bar{2}0$) family of planes, grown on a single crystal substrate having an orientation wherein primary symmetric axis (0001) of said $Mg_xZn_{1-x}O$ semiconductor epitaxial film lies on the surface of said substrate, thereby resulting in zero net charge on said $Mg_xZn_{1-x}O$ film and zero net dipole moment perpendicular to surface of said $Mg_xZn_{1-x}O$ film;
a metal deposited on said $Mg_xZn_{1-x}O$ film to form a Schottky contact; and
an ohmic metal deposited on said $Mg_xZn_{1-x}O$ film to form an ohmic contact wherein energy bandgap of the $Mg_xZn_{1-x}O$ film varies with Mg content.

13. The Schottky diode of claim 12 wherein said substrate is R-plane sapphire, ($01\bar{1}2$) $Al_2O_3$.

14. The Schottky diode of claim 12 wherein said Schottky metal is silver.

15. The Schottky diode of claim 12 wherein said ohmic metal is aluminum.

16. The Schottky diode of claim 12 having means to being applied as a low leakage and high speed ultraviolet photodetector.

17. The Schottky diode of claim 16 wherein said ultraviolet photodetector comprises:
a circular metal-semiconductor metal structure having an inner circle pattern of the Schottky contact deposited on said $Mg_xZn_{1-x}O$ film having ($11\bar{2}0$) family of planes and an outer ring pattern of the ohmic electrode deposited on said $Mg_xZn_{1-x}O$ film.

18. The Schottky diode of claim 17 wherein wavelength of said photodetector varies with Mg content.

19. The Schottky diode of claim 18 wherein said Schottky contact is formed with a silver layer deposited on said $Mg_xZn_{1-x}O$ film.

20. The Schottky diode of claim 18 wherein said ohmic electrode is formed with an aluminum layer deposited on said $Mg_xZn_{1-x}O$ film.

21. The Schottky diode of claim 16 wherein said ultraviolet photodetector comprises:
 a metal-semiconductor-metal structure with an interdigital (IDT) pattern, wherein the semiconductor is said $Mg_xZn_{1-x}O$ film having ($11\bar{2}0$) family of planes grown on the single crystal substrate, and the metal is the Schottky metal deposited on said $Mg_xZn_{1-x}O$ film.

22. The Schottky diode of claim 21 wherein said substrate is R-plane sapphire, ($01\bar{1}2$) $Al_2O_3$.

23. The Schottky diode of claim 21 wherein said Schottky metal is silver.

24. The Schottky diode of claim 21 wherein wavelength of said photodetector varies with Mg content.

\* \* \* \* \*